United States Patent
Van Casteren et al.

(10) Patent No.: US 8,120,265 B2
(45) Date of Patent: Feb. 21, 2012

(54) LAMP DRIVER FOR OPERATING A GAS DISCHARGE LAMP

(75) Inventors: Dolf Henricus Jozef Van Casteren, Eindhoven (NL); Edwin Theodorus Maria De Koning, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 439 days.

(21) Appl. No.: 12/517,811

(22) PCT Filed: Dec. 7, 2007

(86) PCT No.: PCT/IB2007/054961
§ 371 (c)(1),
(2), (4) Date: Jun. 5, 2009

(87) PCT Pub. No.: WO2008/072146
PCT Pub. Date: Jun. 19, 2008

(65) Prior Publication Data
US 2010/0315015 A1   Dec. 16, 2010

(30) Foreign Application Priority Data
Dec. 12, 2006  (EP) .................................. 06125947

(51) Int. Cl.
 H05B 41/36   (2006.01)
 G05F 1/163   (2006.01)
(52) U.S. Cl. ..................... 315/224; 315/209 R; 323/222; 323/259; 323/288; 363/97; 363/98
(58) Field of Classification Search ............. 315/209 R, 315/219, 224, 291, 307, 308; 363/16, 21, 363/41, 89, 97, 98; 323/222, 225, 259, 283, 323/285, 288
See application file for complete search history.

(56) References Cited

U.S. PATENT DOCUMENTS

| | | | |
|---|---|---|---|
| 6,028,397 A | 2/2000 | Blankers | |
| 6,104,172 A * | 8/2000 | Josephs et al. | 323/222 |
| 6,278,245 B1 | 8/2001 | Li et al. | |
| 6,489,754 B2 * | 12/2002 | Blom | 323/222 |
| 7,190,151 B2 * | 3/2007 | Ribarich et al. | 323/259 |
| 7,570,030 B2 * | 8/2009 | Effing | 323/222 |
| 7,675,280 B2 * | 3/2010 | Strijker | 323/285 |
| 2005/0023994 A1 | 2/2005 | Samejima et al. | |
| 2005/0212458 A1 | 9/2005 | Powers, Jr. et al. | |
| 2006/0226823 A1 | 10/2006 | O'Meara | |
| 2006/0261746 A1 | 11/2006 | Huang et al. | |
| 2010/0128503 A1 * | 5/2010 | Liu et al. | 363/89 |

FOREIGN PATENT DOCUMENTS

| | | |
|---|---|---|
| WO | 9714274 A1 | 4/1997 |
| WO | 2004023851 A1 | 3/2004 |
| WO | 2006047210 A3 | 5/2006 |

* cited by examiner

*Primary Examiner* — Vibol Tan

(57) ABSTRACT

A lamp driver circuit for operating a gas discharge lamp (La) is proposed, which comprises a switched mode power supply circuit (SMPS) and a first and a second output terminal (OT1, OT2) for supplying a lamp current to the gas discharge lamp (La). The lamp driver circuit further comprises an output capacitor (CO) connected between the SMPS circuit and a ground terminal (GT) and comprises a resistive shunt (Rsh) connected between the ground terminal (GT) and the second output terminal (OT2) for determining the lamp current. An output current sensing circuit for determining a SMPS output current is comprised in the lamp driver circuit instead of a further resistive shunt, which would require a differential voltage measurement. The output current sensing circuit comprises a sensing resistor (RS) connected in series with a sensing capacitor (CS), the series connection being connected in parallel to the output capacitor.

8 Claims, 2 Drawing Sheets

LAMP DRIVER FOR OPERATING A GAS DISCHARGE LAMP

FIELD OF THE INVENTION

The present invention relates to a lamp driver circuit for operating a gas discharge lamp and in particular to a lamp driver circuit comprising a shunt resistor for determining a lamp current for lighting control.

BACKGROUND OF THE INVENTION

Gas discharge lamps, in particular Ultra High Pressure (UHP) lamps, are nowadays used in beamers and projection television systems. Such applications require good lighting control in order to provide a suitable lighting condition. The quality of the output light depends inter alia on a current profile of a current supplied to the lamp. A lamp characteristic of the UHP lamp, in particular a dynamic characteristic, changes over its lifetime. Therefore, accurate control of the current through the UHP lamp over its entire lifetime may be difficult.

It has been proposed to use a microprocessor-based system to implement lighting control. For example, a strategy using iterative learning may be employed in a control method. In such a method, a control signal for a repeating task may be updated iteratively such that a difference between a desired characteristic of the lamp and a corresponding actual characteristic diminishes.

In the above-mentioned iterative learning control method a lamp current may be employed as the controlled lamp characteristic. In order to determine the actual lamp current it is known to incorporate a shunt, in particular a resistive shunt, in the lamp driver circuit. The lamp driver circuit, however, may be a switched mode power supply (SMPS) such as a buck converter or a boost converter. For controlling a SMPS an output current is to be determined. Thereto it is known to incorporate a further resistive shunt in the lamp driver circuit. As two resistive shunts are present, e.g. placed in a ground line, it is known to perform a differential voltage measurement on one of the resistive shunts in order to determine a voltage drop across the resistive shunt. Such a differential voltage measurement requires signal processing circuitry, e.g. comprising a differential amplifier. Thus, the straightforward current measurement using two resistive shunts results in a complicated and expensive lamp driver circuit.

OBJECT OF THE INVENTION

It is an object of the present invention to provide a simple and cost-effective lamp driver circuit for operating a gas discharge lamp, which simple and cost-effective lamp driver circuit is suitable for determining a lamp current and a SMPS output current.

SUMMARY OF THE INVENTION

The object is achieved in a lamp driver circuit according to claim 1. The lamp driver circuit comprises a switched mode power supply (SMPS) circuit. The lamp driver circuit comprises a first and a second output terminal for supplying a lamp current to a gas discharge lamp. The gas discharge lamp is connectable between the first and the second output terminal. The lamp driver circuit further comprises an output capacitor connected between the SMPS circuit and a ground terminal. The lamp driver circuit further comprises a resistive shunt connected between the ground terminal and the second output terminal for determining a lamp current and an output current sensing circuit for determining a SMPS output current. The output current sensing circuit comprises a sensing resistor connected in series with a sensing capacitor, which series connection is connected in parallel to the output capacitor.

The lamp current is accurately determinable, since the lamp current is determined using a resistive shunt. As one terminal of the resistive shunt is connected to a ground terminal, a voltage at the other terminal of the resistive shunt equals a voltage drop across the resistive shunt. Hence, the voltage at said other terminal is proportional to the current flowing through the lamp, i.e. the lamp current.

The SMPS output current is substantially equal to the sum of the lamp current and a current flowing through the output capacitor. In order to determine a voltage proportional to the SMPS output current, the series connection of the sensing capacitor and the sensing resistor is connected in parallel to the output capacitor. A current flowing through said series connection is substantially proportional to the current flowing through the output capacitor. A ratio between the output capacitor current and the current flowing through the series connection is substantially equal to the ratio between a capacitance of the output capacitor and a capacitance of the sensing capacitor. The current through the sensing resistor results in a voltage drop across the sensing resistor, which voltage drop is substantially proportional to the current through the output capacitor. Adding this voltage drop and the voltage drop across the resistive shunt results in a voltage that is proportional to the SMPS output current.

In an embodiment the series connection of the sensing capacitor and the sensing resistor is connected between the first output terminal and the second output terminal. In such an embodiment a voltage at a node between the sensing capacitor and the sensing resistor is substantially proportional to the SMPS output current. In this embodiment a strong SMPS output current signal is retrievable at said node. However, a small structural mismatch results due to the fact that the current flowing through the sensing capacitor and the sensing resistor also flows through the resistive shunt.

In an embodiment, the series connection of the sensing capacitor and the sensing resistor is connected between the first output terminal and the ground terminal. For adding the voltage drop across the resistive shunt and the voltage drop across the sensing resistor, the output current sensing circuit further comprises a series connection of a first resistor and a second resistor, which series connection is connected between the second output terminal and a first node between the sensing capacitor and the sensing resistor. In such an embodiment, a voltage at a second node located between the first resistor and the second resistor is substantially proportional to the SMPS output current. Preferably, the resistance of the series connection of the first and the second resistor is substantially larger than the resistance of the sensing resistor. In this embodiment only a negligible additional current, in addition to the lamp current, flows through the resistive shunt, resulting in an accurate lamp current measurement.

In order to enable the use of small components, in an embodiment, a factor N between the capacitance of the output capacitor and the capacitance of the sensing capacitor is selected relatively large, preferably larger than 10, more preferably the factor N=1000, or larger.

In an embodiment wherein the capacitance of the output capacitor and the capacitance of the sensing capacitor differ by the factor N, a resistance of the sensing resistor may be a factor N larger than a resistance of the resistive shunt. Thus, the voltage drop across the resistive shunt and the voltage drop across the sensing resistor are of comparable magnitude and may therefore be added.

In an aspect of the present invention, a lamp assembly comprises a lamp driver circuit according to one of the above-described embodiments and a gas discharge lamp, in particular a Ultra High Pressure (UHP) gas discharge lamp.

BRIEF DESCRIPTION OF THE DRAWINGS

Hereinafter, the present invention is elucidated with reference to non-limiting embodiments as illustrated in the appended drawings, in which.

DETAILED DESCRIPTION OF EXAMPLES

Figure 1:
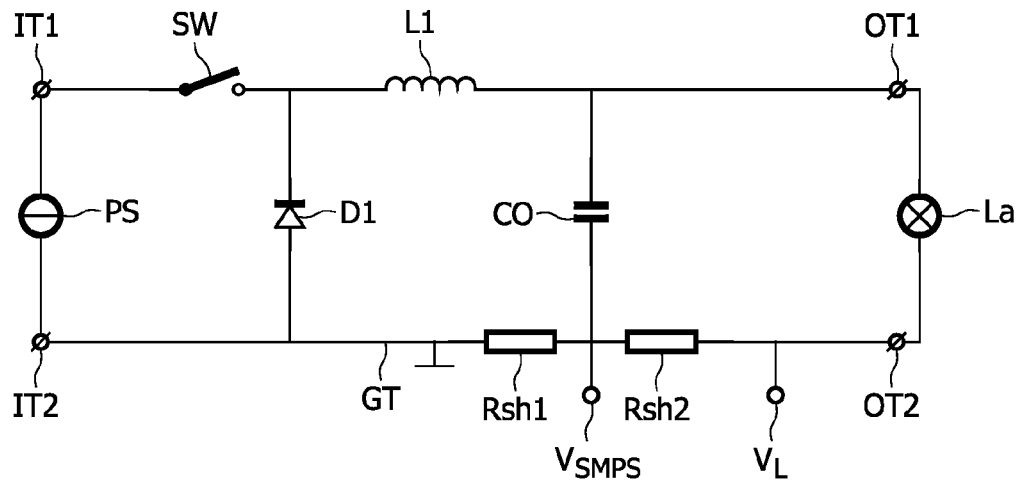
FIG. 1 illustrates a prior art lamp driver circuit comprising two resistive shunts.

In the drawings, like reference numerals refer to like elements. Referring to FIG. 1, a prior art lamp driver circuit comprises a set of input terminals IT1, IT2 for receiving a DC voltage from a power supply PS. A switched mode power supply (SMPS) circuit comprised in the lamp driver circuit comprises a switching element SW, a diode D1, an inductor L1. The illustrated SMPS circuit is a buck converter, which is well known in the art. Therefore, a further detailed discussion of the above-mentioned elements suitable for use in the SMPS circuit is omitted, since, for example, a person skilled in the art will readily recognize that the switching element SW may be a semiconductor switch and the power supply PS may be a rectified mains voltage.

The lamp driver circuit is connected to ground at a ground terminal GT. The lamp driver circuit further comprises an output capacitor CO connected at an output of the SMPS circuit, i.e. output of the inductor L1. The lamp driver circuit further comprises a first output terminal OT1 and a second output terminal OT2, between which a lamp La is connected. A series connection of a first resistive shunt Rsh1 and a second resistive shunt Rsh2 is connected between the second output terminal OT2 and the ground terminal GT. At a terminal between the first and the second resistive shunts Rsh1, Rsh2 the output capacitor CO is connected. The lamp La is a gas discharge lamp, in particular an Ultra High Pressure (UHP) gas discharge lamp.

In operation, the DC voltage supplied by the power supply PS is converted to a DC voltage suitable for operating the lamp La. In order to control the output DC voltage and output current, the output current is to be determined. Thereto, using a control circuit (not shown) the switching element SW is controlled based on the determined output current. For determining the output current, a voltage at a terminal of the first resistive shunt Rsh1 (i.e. the terminal not connected to the ground terminal) is determined. Since the output current flows through the output capacitor CO and the lamp La and then returns to ground, the output current generates a voltage drop across the first resistive shunt Rsh1, which voltage drop results in a output current voltage $V_{SMPS}$ which is substantially proportional to the output current.

The control system (not shown) may further be adapted for lighting control. Thereto, the control system may control a lamp current flowing through the lamp La. In order to determine the lamp current, the second resistive shunt Rsh2 is placed between the first resistive shunt Rsh1 and the lamp La. Since only the lamp current flows through the second resistive shunt Rsh2, a voltage drop across the second resistive shunt Rsh2 is substantially proportional to the lamp current. However, a lamp current voltage $V_L$ at a terminal of the second resistive shunt Rsh2 connected to the lamp La is substantially equal to the sum of the voltage drop across the first resistive shunts Rsh1 and the voltage drop across the second resistive shunt Rsh2. In order to determine the voltage drop across the second resistive shunt Rsh2 a differential measurement needs to be performed.

Figure 2:
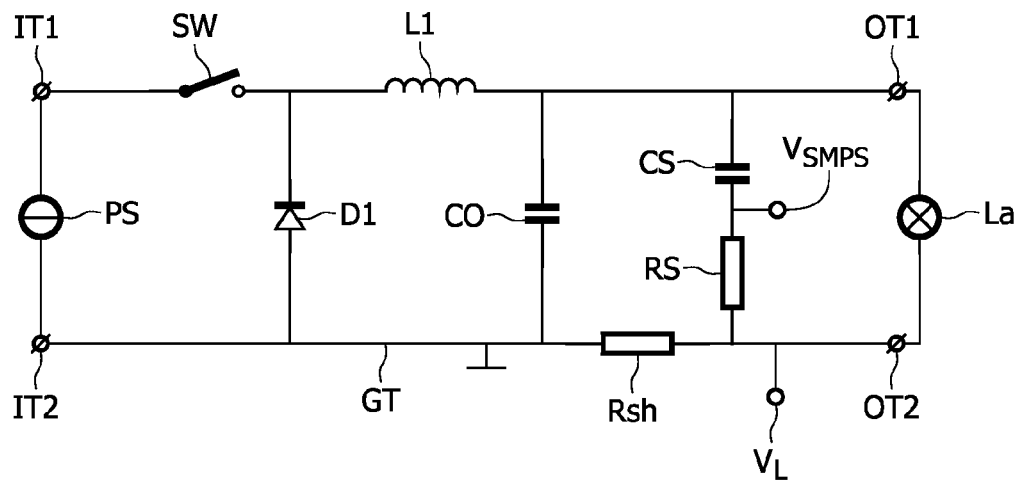
FIG. 2 illustrates a first embodiment of a lamp driver circuit according to the present invention.

In order to prevent that a differential measurement is to be performed, in accordance with an embodiment of the present invention, a lamp driver circuit according to FIG. 2 comprises, compared to the circuit as illustrated in FIG. 1, a same circuit arrangement of a buck converter SMPS circuit. However, instead of two resistive shunts, only a single resistive shunt Rsh is present. The resistive shunt Rsh is connected between the ground terminal GT and the lamp La (the second output terminal OT2), while the output capacitor CO is also connected to the ground terminal, such that the lamp current voltage $V_L$ at the lamp side of the resistive shunt Rsh is substantially equal to a voltage drop across the resistive shunt Rsh. The voltage drop, and therefore the lamp current voltage $V_L$, is substantially proportional to the lamp current.

A series connection of a sensing capacitor CS and a sensing resistor RS is connected in parallel to the output capacitor CO. Due to the capacitive behavior, a current through the series connection is substantially proportional to a current flowing through the output capacitor CO. Hereinafter, it is presumed that the capacitance of the sensing capacitor CS is a factor N smaller than the capacitance of the output capacitor CO, thus equaling:

$$CS = \frac{CO}{N} \qquad \text{(Eq. 1)}$$

Consequently, a current through the sensing capacitor CS is substantially a factor N smaller than a current flowing through the output capacitor CO. The current flowing through the sensing capacitor CS flows also through the sensing resistor RS, thereby generating a voltage drop across the sensing resistor RS.

In order to be able to determine the current output by the SMPS circuit, i.e. the current output by the inductor L1 of the SMPS circuit, a voltage representative of the current flowing through the output capacitor CO, i.e. the voltage drop across the sensing resistor RS, is to be added to the lamp current voltage $V_L$. To allow the lamp current voltage $V_L$ and said voltage drop across the sensing resistor RS being added, these voltages need to be of comparable magnitude. Therefore, in an embodiment, the resistance of the sensing resistor RS is a factor N larger than the resistance of the resistive shunt Rsh, thereby compensating for the factor N smaller current, which is due to the factor N smaller capacitance of the sensing capacitor as above explained. Thus, in such an embodiment, the voltage at a node between the sensing capacitor CS and the sensing resistor RS is substantially equal to a sum of the lamp current voltage $V_L$ and the voltage drop across the sensing resistor RS, which is proportional to the output capacitor current. Hence, the voltage at said node is substantially proportional to the output current of the SMPS circuit and is therefore used as the output current voltage $V_{SMPS}$.

In a practical embodiment, the output capacitor CO may have a capacitance of 1 µF; the sensing capacitor may have a capacitance of 1 nF, thus N being 1000; the resistance of the resistive shunt Rsh may be 25 mΩ and the resistance of the sensing resistor RS may be 25Ω.

Figure 3:
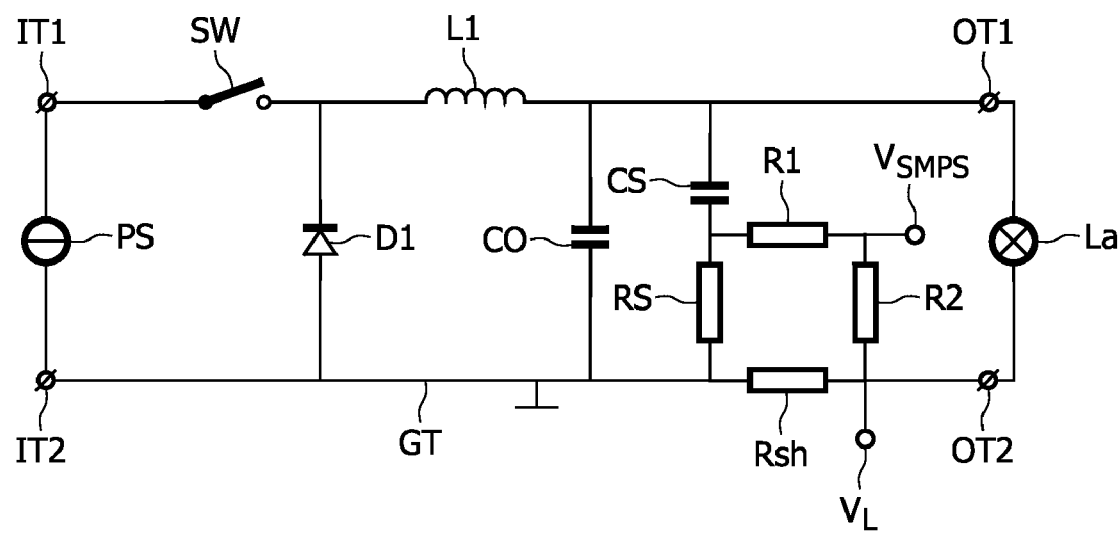
FIG. 3 illustrates a second embodiment of a lamp driver circuit according to the present invention.

It is noted that in the embodiment as shown in FIG. 2 a number of second order effects may lead to a small and, depending on the application, acceptable structural mismatch in the determined current values compared to the actual current values. FIG. 3 illustrates a more accurate embodiment. In the embodiment of FIG. 3, compared to the embodiment of FIG. 2, the series connection of the sensing capacitor CS and the sensing resistor RS is now connected between the first output terminal OT1 and the ground terminal GT. The resistive shunt Rsh is connected between the ground terminal GT and the lamp La (the second output terminal OT2) for determining a lamp current based on the voltage drop across the resistive shunt Rsh, which is equal to the lamp current voltage $V_L$.

At a first node between the sensing capacitor CS and the sensing resistor RS a series connection of a first resistor R1 and a second resistor R2 is connected. The series connection is further connected to the second output terminal OT2.

Presuming that Eq. 1 is still valid, a current flowing through the sensing capacitor CS is a factor N smaller than a current flowing through the output capacitor CO. In this embodiment, the current through the sensing capacitor CS is split in two parts. A first part flows through the sensing resistor RS and a second part flows through the series connection of the first and the second resistors R1, R2:

$$I_{RS} = \frac{I_{CO}}{N} - I_{R1,R2} \qquad (Eq.\ 2)$$

wherein $I_{RS}$ is the current flowing through the sensing resistor RS, $I_{CO}$ is the current flowing through the output capacitor CO, N is the factor as introduced in Eq. 1, and $I_{R1,R2}$ is the current flowing through the series connection of the first and the second resistor R1, R2. An output current voltage $V_{SMPS}$ equals a sum of a voltage drop across the second resistor R2 and the lamp current voltage $V_L$. The output current voltage $V_{SMPS}$ is substantially proportional to the current output by the SMPS circuit, in particular the current flowing through the inductor L1, as is explained hereinafter.

Presuming that the resistance of the sensing resistor RS is a factor N larger than a resistance of the resistive shunt Rsh:

$$RS = N \cdot Rsh \qquad (Eq.\ 3)$$

and presuming that the resistance of the sensing resistor RS is insignificant compared to a resistance of the first resistor R1:

$$RS \ll R1 \qquad (Eq.\ 4)$$

and defining that $$\alpha \equiv \frac{R2}{R1} \qquad (Eq.\ 5)$$

it may be determined that $$V_{SMPS} = \frac{Rsh}{(1+\alpha)}(I_{La} + \alpha \cdot I_{CO}) \qquad (Eq.\ 6)$$

wherein $I_{LA}$ is the current flowing through the lamp La. Selecting the resistance of the first and the second resistor R1, R2 such that α=1, i.e. R1=R2, and considering that the output current of the SMPS circuit is substantially equal to the current through the lamp $I_{La}$ and the current through the output capacitor $I_{CO}$, Eq. 6 becomes $$V_{SMPS} = \frac{Rsh}{2} I_{SMPS} \qquad (Eq.\ 7)$$

and thus the output current voltage $V_{SMPS}$ is substantially proportional to the output current. In a practical embodiment, the output capacitor may have a capacitance of 1 μF, N may be 1000, the sensing capacitor CS may have a capacitance of 1 nF, the resistive shunt Rsh may have a resistance of 25 mΩ, the sensing resistor RS may have a resistance of 25Ω, and the first and the second resistors R1, R2 may each have a resistance of 1 kΩ, thereby satisfying Eq. 4.

Although detailed embodiments of the present invention are disclosed herein, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the mere fact that certain measures are recited in mutually different dependent claims does not indicate that a combination of these measures cannot be used to advantage.

Further, the terms and phrases used herein are not intended to be limiting; but rather, to provide an understandable description of the invention. The terms "a" or "an", as used herein, are defined as one or more than one. The term another, as used herein, is defined as at least a second or more. The terms including and/or having, as used herein, are defined as comprising (i.e., open language). The term coupled, as used herein, is defined as connected, although not necessarily directly and not necessarily by means of wires.

The invention claimed is:

1. Lamp driver circuit for operating a gas discharge lamp, the lamp driver circuit comprising:
    a switched mode power supply, SMPS, circuit;
    a first and a second output terminal for supplying a lamp current to the gas discharge lamp;
    an output capacitor connected between the SMPS circuit and a ground terminal;
    a resistive shunt connected between the ground terminal and the second output terminal for determining a lamp current;
    an output current sensing circuit for determining a SMPS output current, the output current sensing circuit comprising a sensing resistor connected in series with a sensing capacitor, the series connection being connected in parallel to the output capacitor.

2. Lamp driver circuit according to claim 1, wherein the series connection of the sensing capacitor and the sensing resistor is connected between the first output terminal and the second output terminal, a voltage at a node between the sensing capacitor and the sensing resistor being substantially proportional to the SMPS output current.

3. Lamp driver circuit according to claim 1, wherein the series connection of the sensing capacitor and the sensing resistor is connected between the first output terminal and the ground terminal, the output current sensing circuit further comprising a series connection of a first resistor and a second resistor, the series connection of the first resistor and the second resistor being connected between the second output terminal and a first node between the sensing capacitor and the sensing resistor, a voltage at a second node between the first resistor and the second resistor being substantially proportional to the SMPS output current.

4. Lamp driver circuit according to claim 3, wherein a resistance of the first and/or the second resistor is substantially larger than a resistance of the sensing resistor.

5. Lamp driver circuit according to claim 1, wherein a capacity of the sensing capacitor is a factor N smaller than a capacity of the output capacitor.

6. Lamp driver circuit according to claim 5, wherein a resistance of the sensing resistor is a factor N larger than a resistance of the resistive shunt.

7. Lamp driver circuit according to claim 5, wherein the factor N is larger than 10, in particular N=1000.

8. Lamp driver circuit according to claim 1, wherein the SMPS circuit is selected from the group consisting of: a buck converter, a boost converter, and a buck-boost converter.

* * * * *